United States Patent
Spikes, Jr. et al.

(10) Patent No.: US 6,458,678 B1
(45) Date of Patent: Oct. 1, 2002

(54) TRANSISTOR FORMED USING A DUAL METAL PROCESS FOR GATE AND SOURCE/DRAIN REGION

(75) Inventors: Thomas E. Spikes, Jr., Round Park, TX (US); Frederick N. Hause, Austin, TX (US); David D. Wu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/625,130

(22) Filed: Jul. 25, 2000

(51) Int. Cl.[7] .................. H01L 21/3205; H01L 21/4763
(52) U.S. Cl. .................. 438/592; 438/197; 438/299; 438/303; 438/592; 438/682
(58) Field of Search .................. 438/142, 197, 438/299, 303, 585, 591, 592, 649, 651, 652, 655, 657, 664, 682, 684, 754, 755, 926; 257/384, 388, 412, 413

(56) References Cited

U.S. PATENT DOCUMENTS

| | | | |
|---|---|---|---|
| 5,352,631 A | * 10/1994 | Sitaram et al. | 438/300 |
| 5,656,519 A | * 8/1997 | Mogami | 438/303 |
| 5,731,239 A | * 3/1998 | Wong et al. | 438/296 |
| 5,856,225 A | * 1/1999 | Lee et al. | 438/291 |
| 5,966,597 A | * 10/1999 | Wright | 438/197 |
| 5,994,193 A | * 11/1999 | Gardner et al. | 438/303 |

* cited by examiner

Primary Examiner—Matthew Smith
Assistant Examiner—Craig P. Lytle
(74) Attorney, Agent, or Firm—Williams, Morgan & Amerson, P.C.

(57) ABSTRACT

A method for forming a semiconductor device includes providing a substrate and forming a gate stack on the substrate. The gate stack includes a gate electrode having a thickness. Source/drain regions are formed in the substrate proximate the gate stack, and a first metal silicide layer is formed over the source drain regions. The thickness of the gate electrode is reduced, and a second metal silicide layer is formed over the reduced thickness gate electrode.

12 Claims, 3 Drawing Sheets

TRANSISTOR FORMED USING A DUAL METAL PROCESS FOR GATE AND SOURCE/DRAIN REGION

BACKGROUND OF THE INVENTION

1. Field of the Invention

This invention relates generally to the field of semiconductor processing and, more particularly, to a transistor formed using a dual metal process for gate and source/drain region.

2. Description of the Related Art

Semiconductor integrated circuit devices are employed in numerous applications, including microprocessors. Generally, the performance of a semiconductor device is dependent on both the density and the speed of the devices formed therein. A common element of a semiconductor device that has a great impact on its performance is a transistor. Design features, such as gate length and channel length, are being steadily decreased in order to achieve higher package densities and to improve device performance. The rapid advance of field effect transistor design has affected a large variety of activities in the field of electronics in which the transistors are operated in a binary switching mode. In particular, complex digital circuits, such as microprocessors and the like, demand fast-switching transistors. Accordingly, the distance between the drain region and the source region of a field effect transistor, commonly referred to as the channel length or gate length dimension, has been reduced to accelerate the formation of a conductive channel between a source and a drain electrode as soon as a switching gate voltage is applied and, moreover, to reduce the electrical resistance of the channel.

A transistor structure has been created where the longitudinal dimension of the transistor, commonly referred to as the width dimension, extends up to 20 μm, whereas the distance of the drain and source, i.e., the gate length, may be reduced down to 0.2 μm or less. As the gate length of the channel has been reduced to obtain the desired switching characteristic of the source-drain line, the length of the gate electrode is also reduced. Since the gate electrode is typically contacted at one end of its structure, the electrical charges have to be transported along the entire width of the gate electrode, i.e., up to 20 μm, to uniformly build up the transverse electric field that is necessary for forming the channel between the source and drain regions. Due to the small length of the gate electrode, which usually consists of polycrystalline silicon, the electrical resistance of the gate electrode is relatively high, and it may cause high RC-delay time constants. Hence, the transverse electrical field necessary for fully opening the channel is delayed, thereby further deteriorating the switching time of the transistor line. As a consequence, the rise and fall times of the electrical signals are increased, and the operating frequency, i.e., the clock frequency, has to be selected so as to take into account the aforementioned signal performance.

In view of the foregoing, the switching times of field effect transistors are no longer only limited by the drain and source characteristics, i.e., dimension and resistance, but also significantly depend on the signal propagation along the gate electrode. However, the resistance of the gate electrode affects the propagation time of a signal along the gate width direction. To minimize the electrical resistance of the drain and source regions, as well as that of the gate electrode, a silicidation process is usually performed in which a portion of the aforementioned regions are transformed into a metal silicide region in order to lower the respective electrical resistances. The depth of the metal silicide regions on the surfaces of the drain region, source region and gate electrode is limited by the requirements for the integrity of shallow drain/source junctions. That is, the metal silicide regions can only be made a certain thickness without adversely impacting the source/drain regions.

Transistors are formed through a series of steps. First, a gate insulation layer is formed over a portion of a substrate. Thereafter, a polysilicon gate electrode is formed over the gate insulation layer. Implants are then conducted to form source/drain (S/D) regions of the transistor. Typically, a metal silicide layer, such as titanium silicide is formed over the source/drain regions and a top portion of the gate electrode to lower the resistance of subsequently formed contacts. Reductions in contact resistance to the various parts of the transistor increases the speed of the device by reducing the time constants associated with its operation.

The present invention is directed to overcoming, or at least reducing the effects of, one or more of the problems set forth above.

SUMMARY OF THE INVENTION

One aspect of the present invention is seen in a method for forming a semiconductor device. The method includes providing a substrate and forming a gate stack on the substrate. The gate stack includes a gate electrode having a thickness. Source/drain regions are formed in the substrate proximate the gate stack, and a first metal silicide layer is formed over the source drain regions. The thickness of the gate electrode is reduced, and a second metal silicide layer is formed over the reduced thickness gate electrode.

BRIEF DESCRIPTION OF THE DRAWINGS

The invention may be understood by reference to the following description taken in conjunction with the accompanying drawings, in which like reference numerals identify like elements, and in which.

Figure 1:
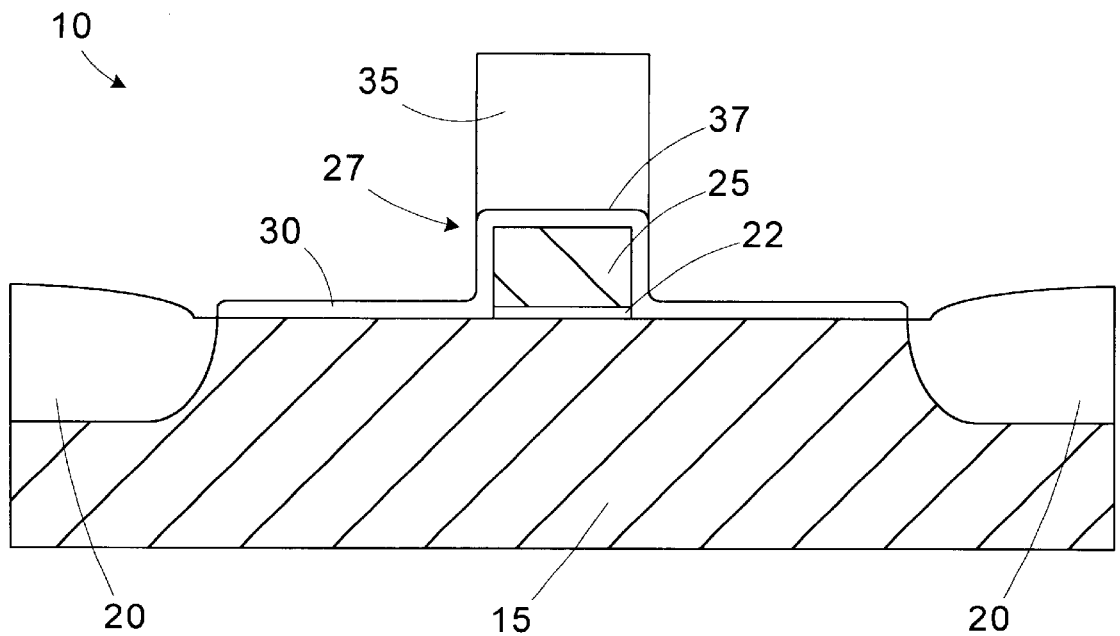
FIG. 1 is a cross section of a partially completed semiconductor device in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention is directed to a method of forming low resistance metal silicide regions on a gate electrode of a transistor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is demonstrated with reference to a MOS transistor formed in a silicon substrate, the present invention may be applied to any kind of semiconductor in which a narrow gate structure is required. For example, the semiconductor substrate can be any appropriate material such as silicon, silicon-germanium, etc.

Referring now to the figures, a process for forming a semiconductor device 10 in accordance with the present invention is shown. Although the various regions and structures of the semiconductor device 10 are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nonetheless, the attached drawings are included to describe and explain illustrative examples of the present invention.

FIG. 1 illustrates a cross section of the semiconductor device 10. The device 10 includes a substrate 15 (e.g., P type) with isolation structures 20 formed therein. In the illustrated embodiment, the isolation structures 20 are shallow trench isolation (STI) structures, but other isolation structures 20, such as local oxidation of silicon (LOCOS) structures may be used. A gate insulation layer 22 is formed on the substrate 15. A gate electrode 25 is formed over the gate insulation layer 22. The gate insulation layer 22 isolates the gate electrode 25 from the substrate 15. Collectively, the gate electrode 25 and gate isolation layer 22 are referred to as a gate stack 27. The gate electrode 25 may be formed from a variety of materials and by a variety of techniques. For example, the gate electrode 25 may be comprised of polycrystalline silicon, and it may have a thickness ranging from approximately 1000–3000 Angstroms. The gate electrode 25 may be formed by patterning a layer of material that is formed by a deposition process, such as an LPCVD or PECVD process. The gate insulation layer 22 may also be formed from a variety of materials, e.g., an oxide, an oxynitride, silicon dioxide, silicon oxynitride, or any other material sufficient to allow the gate insulation layer 22 to serve its intended purpose. The gate insulation layer 22 may be formed by a variety of techniques, such as thermal oxidation, deposition, etc. A dielectric layer 30, such as silicon dioxide, is formed over the gate stack 27 and the exposed portions of the substrate 15. A photoresist layer 35 is deposited and patterned to cover the top surface 37 of the gate stack 27.

Figure 2:
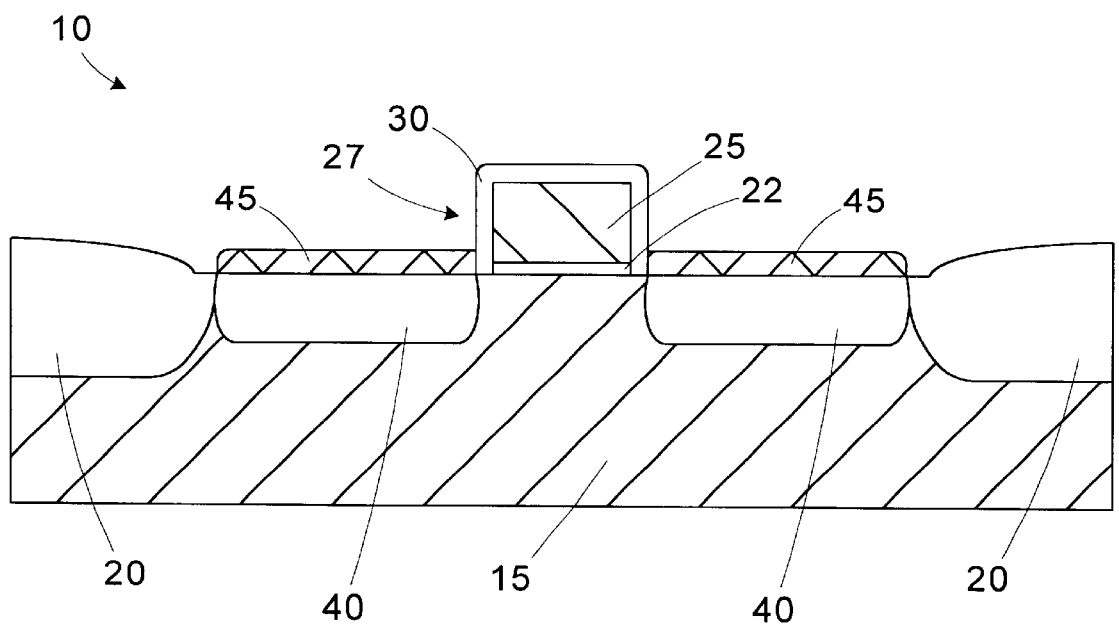
FIG. 2 is a cross section of the semiconductor device of FIG. 1 following formation of a first metal silicide layer over source/drain regions of the semiconductor device.

Turning to FIG. 2, the portions of the dielectric layer 30 not masked by the photoresist layer 35 are removed. Source/drain regions 40 are formed in the substrate 15 by one or more typical implantation processes well known in the art. After formation of the source/drain regions 40, a first silicide layer 45 is formed. In the illustrated embodiment, the thickness of the first silicide layer 45 is about is between about 100 and 700 Angstroms. As well known in the art, silicide may be formed by blanket depositing a refractory metal (e.g., by sputtering) and performing one or more rapid thermal annealing processes. The portions of the metal layer contacting silicon react to form the metal silicide. Typically, not all of the refractory metal layer overlying silicon is converted to a metal silicide, since the metal silicide forms at the boundary of the refractory metal and the silicon. Portions of the metal layer not contacting silicon are unconverted and may be removed using a selective etch process such as a wet strip. In the illustrated embodiment, the silicide layer 45 comprises cobalt silicide, but other metal silicides may be used, such as cobalt silicide, titanium silicide, tantalum silicide, zirconium silicide, tungsten silicide, nickel silicide, platinum silicide, molybdenum silicide, etc.

Figure 3:
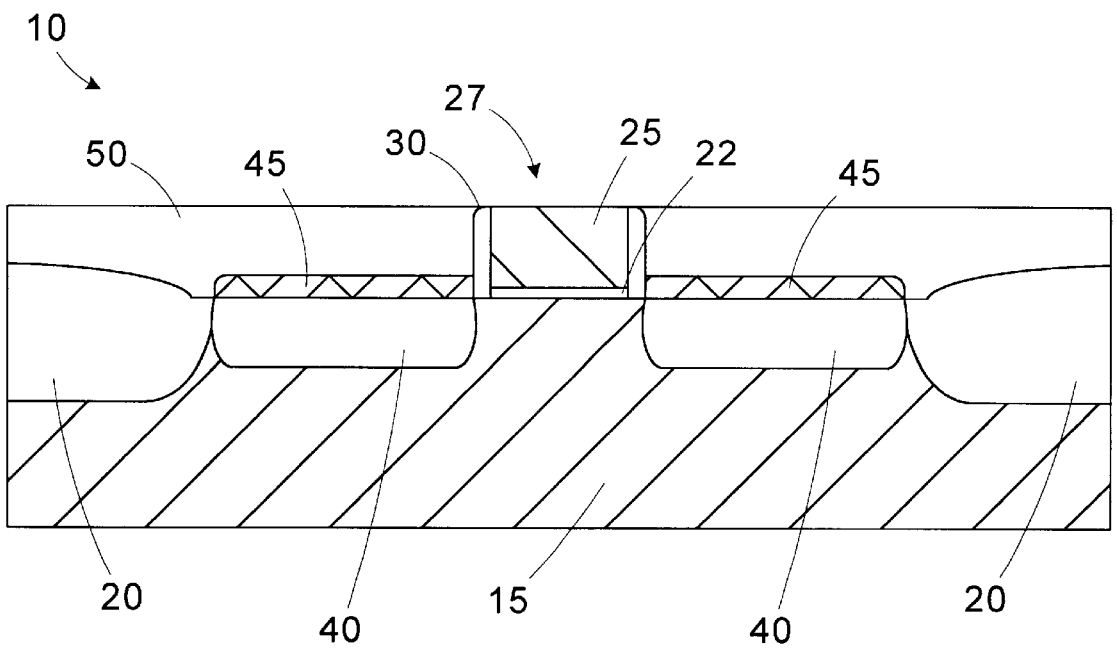
FIG. 3 is a cross section of the semiconductor device of FIG. 2 following the formation and polishing of an interlayer dielectric layer to expose a gate electrode of the semiconductor device.

As seen in FIG. 3, an interlayer dielectric layer 50, such as silicon dioxide formed using tetraethoxysilane (TEOS), is formed over the gate stack 27 and surrounding features. The interlayer dielectric layer 50 is polished (e.g., using a chemical mechanical polishing process) until the top of the gate electrode 25 is exposed. Hence, the portion of the dielectric layer 30 on the top surface 37 of the gate electrode 25 is removed. The remaining portions of the dielectric layer 30 define spacers on the side of the gate stack 27.

Figure 4:
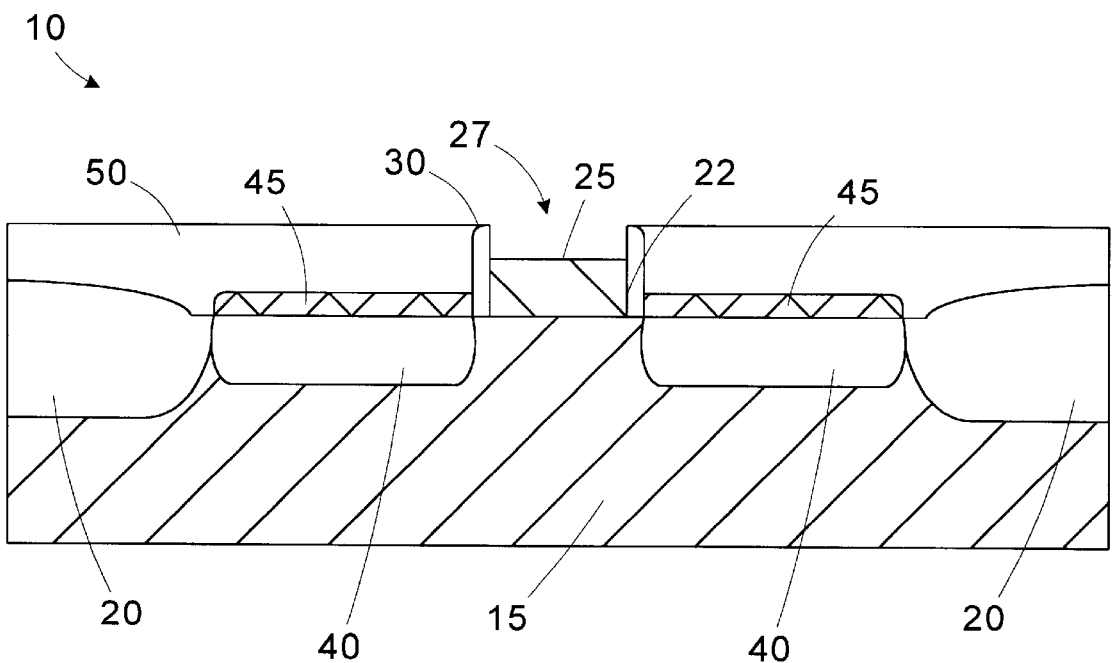
FIG. 4 is a cross section of the semiconductor device of FIG. 3, where a portion of the gate electrode is removed.
Figure 5:
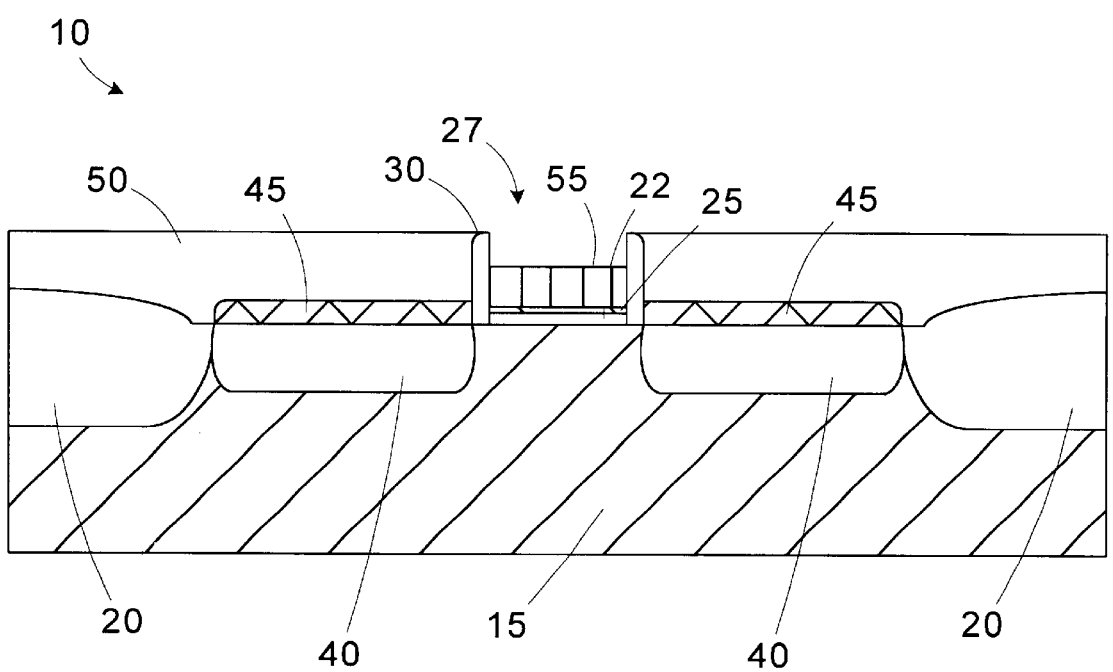
FIG. 5 is a cross section of the semiconductor device of FIG. 4 following the formation of a second metal silicide layer over remaining portion of the gate electrode.

Turning to FIG. 4, a portion of the gate electrode 25 is removed using an etch process, such as a wet etch or a reactive ion etch. Subsequently, as seen in FIG. 5, a second silicide layer 55 is formed over the remaining portion of the gate electrode 25. In the illustrated embodiment, the second silicide layer 55 is a cobalt silicide layer having a thickness greater than the thickness of the first silicide layer 45 (e.g., between about 500 and 1500 Angstroms). Again, other metals may be used in lieu of cobalt, however, cobalt is well adapted for use with higher density (ie., smaller) features. The metals used to form the first and second silicide layers 45, 55 may be the same or different. During the formation of the silicide a portion of the polysilicon forming the gate electrode 25 is consumed. The depth of penetration depends on the thickness of the refractory metal layer deposited to form the metal silicide and the length of time the semiconductor device 10 is annealed. The second silicide layer 55 may be formed such that the majority of the polysilicon forming the gate electrode 25 is consumed.

The thickness of the second silicide layer 55 is targeted to result in a final depth that will provide low gate resistance, but still maintain a minimum thickness of the polysilicon in the gate electrode 25 over the gate insulation layer 22. The minimum thickness of the polycrystalline gate electrode 25 after silicidation will vary depending upon the device under construction and its operational parameters. However, in general, using present day technology, the residual thickness of the gate electrode 25 should ranges from approximately 50–500 Angstroms. This residual thickness ensures that the desired and well-known characteristics of the silicon-oxide interface are maintained and prevents electrical breakdown of the transistor due to metal atoms diffusing into the gate insulation layer 22.

The present invention provides a transistor in an integrated circuit and a method of manufacturing the same, wherein an increased portion of the gate electrode is converted into a low-resistance metal silicide region, thereby significantly lowering the overall electrical resistance of the gate electrode. Increasing the thicknesses of the second silicide layer 55 as accomplished by the methods depicted herein decreases the resistance of the gate electrode 25. A decreased resistance correlates to a lower time constant and a resulting higher speed. The low-resistance metal silicide contacts provided by the first silicide layer 45 over the source/drain regions 40 may be made in such a manner so as to exhibit a small depth in order to meet the requirements of shallow junction integrity. Thus, further device scaling is supported while, at the same time, the signal performance of the device is improved. Another advantage of the method of FIGS. 1–5 is that the proximity of the interlayer dielectric layer 50 to the spacers 30 prevents the second silicide layer 55 from wrapping around the gate electrode 25, an effect that may have deleterious consequences if too large in magnitude. Additionally, because the thickness of the gate electrode 25 is reduced prior to forming the second silicide layer 55, the time required to complete the rapid thermal anneal to form the metal silicide is reduced. This time reduction results in a corresponding reduction to the damage done to doped implant regions in the semiconductor device 10, such as the source/drain regions 40.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:

providing a substrate, forming a gate stack on the substrate, the gate stack comprising a gate electrode having a thickness;

forming spacers adjacent the gate stack by:
  forming a dielectric layer over the gate stack and portions of the substrate proximate the gate stack;
  forming a photoresist layer over the portion of the dielectric layer disposed above the gate stack; and
  removing the portion of the dielectric layer disposed over the substrate;

forming source/drain regions in the substrate proximate the gate stack;

forming a first metal silicide layer over the source drain regions;

reducing the thickness of the gait electrode; and forming a second metal silicide layer over the reduced thickness gate electrode.

2. The method of claim 1, wherein forming the second metal silicide layer comprises forming the second metal silicide layer having a thickness greater than a thickness of the first metal silicide layer.

3. The method of claim 1, further comprising:

removing the photoresist layer;

forming an interlayer dielectric layer over the substrate and first metal silicide layer; and removing a portion of the interlayer dielectric layer to expose the gate.

4. The method of claim 3, wherein removing the portion of the dielectric layer comprises polishing the interlayer dielectric layer to expose the gate.

5. The method of claim 1, wherein reducing the thickness of the gate electrode comprises reducing the thickness of the gate electrode by at least about one third.

6. The method of claim 1, wherein forming the first metal silicide layer comprises forming a cobalt silicide layer.

7. The method of claim 1, wherein the second metal silicide layer comprises at least one of cobalt silicide, titanium silicide, tantalum silicide, zirconium silicide, tungsten silicide, nickel silicide, platinum silicide, molybdenum silicide.

8. A method for forming a semiconductor device, comprising:

providing a substrate;

forming a gate stack on the substrate, the gate stack comprising a gate electrode having a thickness;

forming a dielectric layer over the gate stack and portions of the substrate proximate the gate stack;

forming a photoresist layer over the portion of the dielectric layer disposed above the gate stack;

removing the portion of the dielectric layer disposed over the substrate;

forming source/drain regions in the substrate proximate the gate stack;

forming a first metal silicide layer over the source drain regions;

removing the photoresist layer;

forming an interlayer dielectric layer over the substrate and first metal silicide layer;

removing a portion of the interlayer dielectric layer to expose the gate electrode;

reducing the thickness of the gate electrode; and forming a second metal silicide layer over the reduced thickness gate electrode.

9. The method of claim 8, wherein forming the second metal silicide layer comprises forming the second metal silicide layer having a thickness greater than a thickness of the first metal silicide layer.

10. The method of claim 8, wherein reducing the thickness of the gate electrode comprises reducing the thickness of the gate electrode by at least about one third.

11. The method of claim 8, wherein forming the first metal silicide layer comprises forming a cobalt silicide layer.

12. The method of claim 8, wherein the second metal silicide layer comprises at least one of cobalt silicide, titanium silicide, tantalum silicide, zirconium silicide, tungsten silicide, nickel silicide, platinum silicide, molybdenum silicide.

* * * * *